United States Patent

Song

(10) Patent No.: US 9,691,467 B2
(45) Date of Patent: Jun. 27, 2017

(54) MEMORY AND MEMORY SYSTEM INCLUDING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 567 days.

(21) Appl. No.: 14/084,243

(22) Filed: Nov. 19, 2013

(65) Prior Publication Data

US 2014/0359208 A1 Dec. 4, 2014

(30) Foreign Application Priority Data

May 28, 2013 (KR) .................. 10-2013-0060476

(51) Int. Cl.
*G06F 13/00* (2006.01)
*G11C 11/406* (2006.01)
*G11C 7/02* (2006.01)

(52) U.S. Cl.
CPC .......... *G11C 11/40615* (2013.01); *G11C 7/02* (2013.01)

(58) Field of Classification Search
CPC ............ G11C 11/406; G11C 7/00; G11C 8/00
See application file for complete search history.

(56) References Cited

U.S. PATENT DOCUMENTS

| | | | |
|---|---|---|---|
| 2003/0193829 A1* | 10/2003 | Morgan | G11C 5/14 365/222 |
| 2005/0195680 A1* | 9/2005 | Higashi | G11C 11/4085 365/236 |
| 2007/0014174 A1* | 1/2007 | Ohsawa | G11C 11/406 365/222 |
| 2011/0141836 A1 | 6/2011 | Luthra et al. | |
| 2014/0085995 A1* | 3/2014 | Greenfield | G11C 7/24 365/201 |

FOREIGN PATENT DOCUMENTS

KR 1020140038246 3/2014

* cited by examiner

*Primary Examiner* — Charles Rones
*Assistant Examiner* — Han Doan
(74) *Attorney, Agent, or Firm* — IP & T Group LLP

(57) ABSTRACT

A memory includes a plurality of word lines each of which are connected to one or more memory cells, an address detection unit suitable for detecting a target address of a target word line among the plurality of word lines, wherein the target word line has an activation history satisfying a predetermined condition, and a control unit suitable for activating one or more word line among the plurality of word lines each time a refresh command is applied, and activating one or more adjacent word lines in response to a refresh command after detection of the target address, wherein the adjacent word line is adjacent to the target word line and identified by the target address.

5 Claims, 8 Drawing Sheets

MEMORY AND MEMORY SYSTEM INCLUDING THE SAME

CROSS-REFERENCE TO RELATED APPLICATIONS

The present application claims priority of Korean Patent Application No. 10-2013-0060476, filed on May 28, 2013, which is incorporated herein by reference in its entirety.

BACKGROUND

1. Field

Exemplary embodiments of the present invention relate to a memory that may prevent degradation of stored data due to word line disturbance in a memory cell and a memory system including the same.

2. Description of the Related Art

As the degree of integration of a memory increases, an interval between a plurality of word lines included in the memory is reduced. As the interval between the word lines is reduced, a coupling effect between adjacent word lines increases.

Whenever data is inputted and outputted to and from a memory cell, a word line toggles between an activated or active state and a deactivated or inactive state. As the coupling effect between adjacent word lines increases as described above, data of a memory cell connected with a word line adjacent to a frequently activated word line is damaged. This is known as word line disturbance. Due to the word line disturbance, a problem arises wherein the data of a memory cell may be damaged before the memory cell is refreshed.

FIG. 1 is a diagram illustrating a part of a cell array included in a memory.

In FIG. 1, 'WLL' indicates a word line that has a large number of activations or a high activation frequency and 'WLL−1' and 'WLL+1' indicate word lines that are disposed adjacent to the word line 'WLL'. 'CL' indicates a memory cell connected with the word line 'WLL', 'CL−1' indicates a memory cell connected with the word line 'WLL−1' and 'CL+1' indicates a memory cell connected with the word line 'WLL+1'. The respective memory cells 'CL', 'CL−1' and 'CL+1' include cell transistors TL, TL−1 and TL+1 and cell capacitors CAPL, CAPL−1 and CAPL+1.

In FIG. 1, when the word line 'WLL' is activated or deactivated, the voltages of the word lines 'WLL−1' and 'WLL+1' are increased or decreased due to a coupling effect occurring among the word lines 'WLL', 'WLL−1' and 'WLL+1' and an influence is exerted on the amounts of charges of the cell capacitors CAPL−1 and CAPL+1. Therefore, frequent activation of the word line 'WLL' results in the word line 'WLL' toggling between an activated state and a deactivated state and leads to increased changes in the amounts of charges stored in the cell capacitors CAPL−1 and CAPL+1 included in the memory cells 'CL−1' and the 'CL+1', so that the data of the memory cells 'CL−1.' and the 'CL+1' may be degraded.

Furthermore, as electromagnetic waves, which are generated while the word line toggles between the activated state and the deactivated state, introduce or discharge electrons into or from the cell capacitors of the memory cells connected with adjacent word lines, data may be damaged.

SUMMARY

Various embodiments are directed to a memory that may refresh the memory cells connected to word lines adjacent to a word line with the large number of activations or a high activation frequency, thereby preventing word line disturbance to the data of the memory cells and a memory system including the same.

Also, various embodiments are directed to a memory that may refresh the memory cells connected to word lines adjacent to a word line with the large number of activations or a high activation frequency without commands or addresses, thereby reducing a time required to prevent word line disturbance to the data of the memory cells and a memory system including the same.

In an embodiment, a memory may include a plurality of word lines each of which are connected to one or more memory cells, an address detection unit suitable for detecting a target address of a target word line among the plurality of word lines, wherein the target word line has an activation history satisfying a predetermined condition, and a control unit suitable for activating one or more word line among the plurality of word lines each time a refresh command is applied, and activating one or more adjacent word lines in response to a refresh command after detection of the target address, wherein the adjacent word line is adjacent to the target word line and identified by the target address.

In an embodiment, a memory may include a plurality of word lines each of which are connected to one or more memory cells, an address detection unit suitable for detecting a target address of a target word line among the plurality of word lines, wherein the target word line has an activation history satisfying a predetermined condition, an address counting unit suitable for performing a counting operation in response to a refresh command and generating a counting address according to a result of the counting operation, and a control unit suitable for activating a word line corresponding to the counting address among the plurality of word lines in response to the refresh command and activating one or more adjacent word lines in response to the refresh command after detection of the target address, wherein the adjacent word line is adjacent to the target word line and identified by the target address.

In an embodiment, a memory may include a plurality of word lines each of which are connected to one or more memory cells, an address detection unit suitable for detecting a target address of a target word line among the plurality of word lines, wherein the target word line is a word line of which the number of activations is equal to or greater than a reference number, and a control unit suitable for activating one or more word line among the plurality of word lines each time a refresh command is applied, and activating one or more adjacent word lines in response to a refresh command after detection of the target address, wherein the adjacent word line is adjacent to the target word line and identified by the target address.

In an embodiment, a memory may include a plurality of word lines each of which are connected to one or more memory cells, an address detection unit suitable for detecting a target address of a target word line among the plurality of word lines, wherein the target word line is a word line of which the number of activations of the target word line per preset input number of an activation command is equal to or greater than a reference number per preset input number of the activation command, and a control unit suitable for activating one or more adjacent word lines in response to a refresh command after detection of the target address, wherein the adjacent word line is adjacent to the target word line and identified by the target address.

In an embodiment, a memory may include a memory including a plurality of word lines each of which are connected to one or more memory cells and an address detection unit suitable for detecting a target address of a target word line among the plurality of word lines and activating one or more word line among the plurality of word lines each time a refresh command is applied, and activating one or more adjacent word lines in response to a refresh command after detection of the target address, and a memory controller suitable for applying a plurality of command signals corresponding to the refresh command to the memory in a refresh operation and applying a plurality of command signals and addresses corresponding to an active command to the memory in an active operation, wherein the target word line has an activation history satisfying a predetermined condition, and wherein the adjacent word line is adjacent to the target word line and identified by the target address.

In an embodiment, a memory system may include a memory including a plurality of word lines each of which are connected to one or more memory cells, an address detection unit suitable for detecting a target address of a target word line among the plurality of word lines and an address counting unit suitable for performing a counting operation in response to a refresh command, generating a counting address according to a result of the counting operation and activating a word line corresponding to the counting address among the plurality of word lines in response to the refresh command and activating one or more adjacent word lines in response to the refresh command after detection of the target address, and a memory controller suitable for applying a plurality of command signals corresponding to the refresh command to the memory in a refresh operation and applying a plurality of command signals and addresses corresponding to an active command to the memory in an active operation, wherein the target word line has an activation history satisfying a predetermined condition, and wherein the adjacent word line is adjacent to the target word line and identified by the target address.

The predetermined condition may be that the number of activations of the target word line is equal to or greater than a reference number.

The predetermined condition may be that the number of activations of the target word line per preset input number of an activation command is equal to or greater than a reference number per preset input number of the activation command.

The memory may activate a word line corresponding to an externally applied address among the plurality of word lines when the active command is applied, activates a word line corresponding to the counting address among the plurality of word lines when the refresh command is applied and activates the adjacent word lines when the refresh command is applied after the target address.

In an embodiment, a memory may include a first cell array including a plurality of first memory cells that are connected to a plurality of word lines, a second cell array including a plurality of second memory cells that are connected to the plurality of word lines and store the numbers of activation of word lines connected thereto among the plurality of word lines, an address detection unit suitable for detecting a target address of a target word line among the plurality of word lines based on values stored in the plurality of second memory cells, wherein the target word line is a word line of which the number of activations is equal to or greater than a reference number, and a control unit suitable for activating one or more word line among the plurality of word lines each time a refresh command is applied, and activating one or more adjacent word lines in response to a refresh command after detection of the target address, wherein the adjacent word line is adjacent to the target word line and identified by the target address.

The value stored in the second memory cells, which are connect to the activated word line in response to an active command, may be increased.

The value stored in the second memory cells, which are connect to the activated word in response to the refresh command, may be initialized In accordance with the above embodiments, since the memory cells connected to word lines adjacent to a word line with the large number of activations or a high activation frequency may be refreshed, it is possible to prevent word line disturbance to data of the memory cells.

Furthermore, since the memory cells connected to word lines adjacent to a word line with the large number of activations or a high activation frequency may be refreshed internally of the memory without being applied with separate commands or addresses, it is possible to shorten a time required to prevent word line disturbance to data of the memory cells.

DETAILED DESCRIPTION

Figure 1:
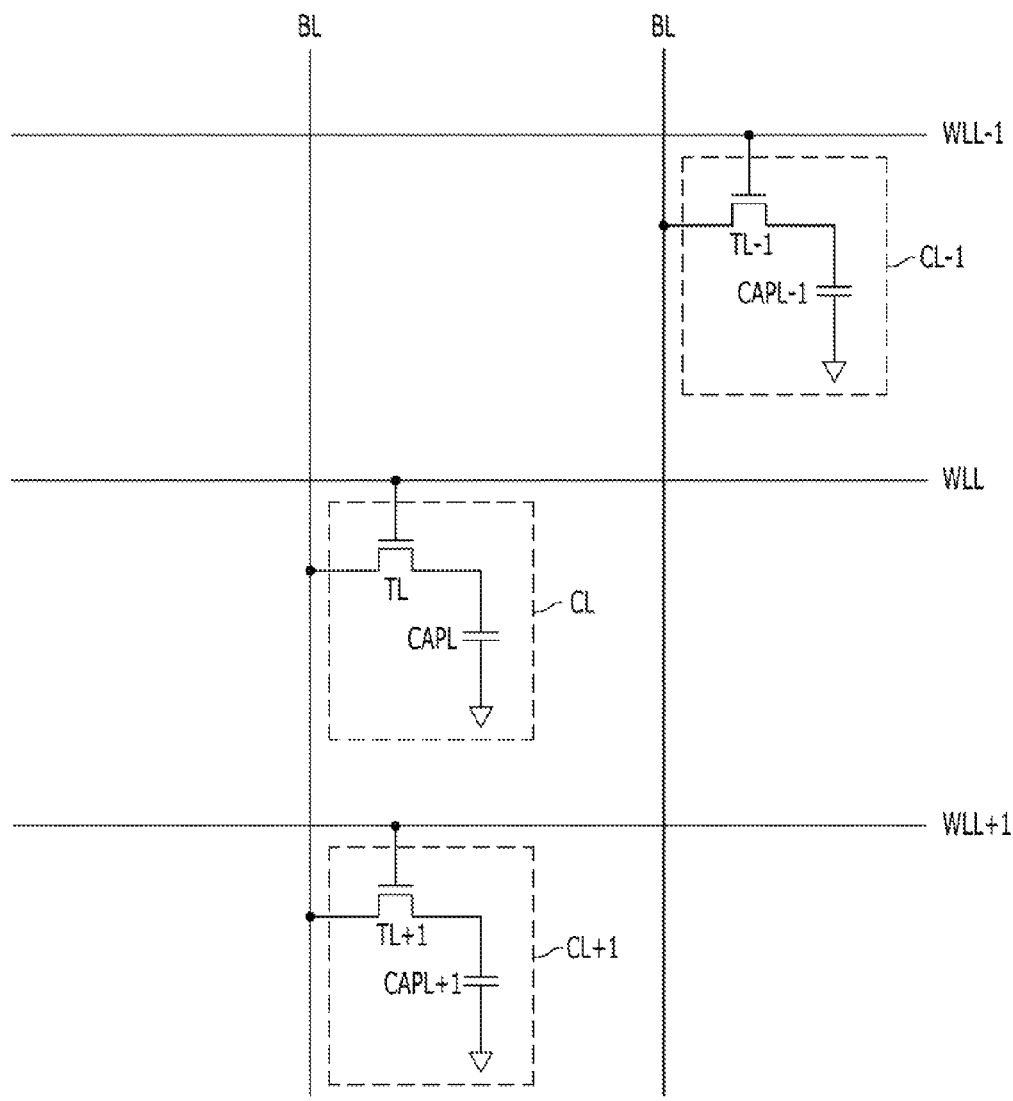
FIG. 1 is a diagram illustrating a part of a cell array included in a memory.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

In the following descriptions a target word line is defined as a word line with the number of activations (i.e. how many activations occur) that is equal to or greater than a reference number or an activation frequency that is equal to or greater than a reference frequency and a target address is defined as an address corresponding to the target word line. An adjacent word line is defined as a word line that is disposed adjacent to the target word line such that the data of the memory cells connected to the adjacent word line are subject to the word line disturbance by the target word line and an adjacent address is defined as an address corresponding to the adjacent word line. The adjacent word line may be a word line that is disposed immediately before or immediately after the target word line.

For reference, in the following descriptions, an address may be a row address that is used in a row operation of a memory. The row address may be an address for selecting a specific address among the plurality of word lines included in the memory. Activation of the specific word line in a refresh operation means refreshing of the memory cells connected to the activated word line.

Figure 2:
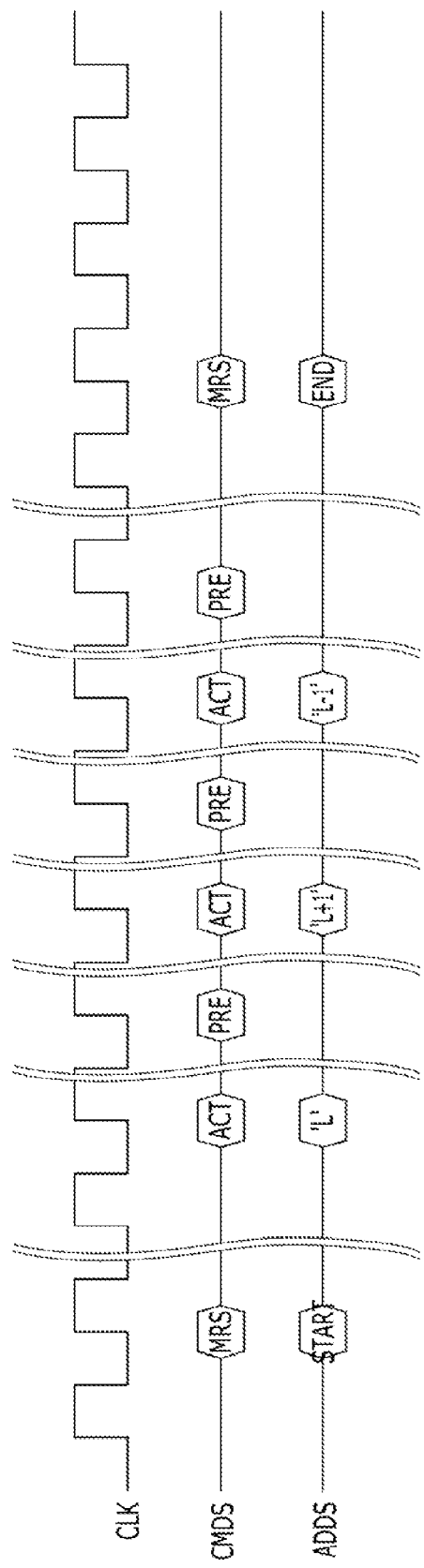
FIG. 2 is a timing diagram illustrating an operation for preventing word line disturbance to data of memory cells connected with adjacent word lines.

FIG. 2 is a timing diagram illustrating an operation for preventing word line disturbance to data of memory cells connected with adjacent word lines.

A memory includes a plurality of word lines and various signals such as command signals CMDs, addresses ADDs and data are inputted to the memory. Hereinafter, the value of an address corresponding to an $L^{th}$ word line (L is a natural number satisfying 1≤L≤N) among the plurality of word lines will be denoted by 'L'.

When a target address is detected, the command signals CMDs and the addresses ADDs are inputted to the memory to allow the memory to perform an operation. The memory enters the operation in response to the commands CMDs and addresses ADDs (START).

In the operation, the target address and the adjacent address are inputted to the memory. The case where the target address is 'L' is described below.

In the operation, the target address L is applied to the memory together with an active command ACT and, after a predetermined time, a precharge command PRE is applied to the memory. The memory activates and then precharges (deactivates) the target word line.

Next, adjacent addresses L+1 and L−1 are sequentially applied. In FIG. 2, the adjacent address L+1 is applied together with a second active command ACT and the adjacent address L−1 is applied together with a third active command ACT. Accordingly, adjacent word lines WLL+1 and WLL−1 corresponding to the adjacent addresses L+1 and L−1 are sequentially activated and the memory cells connected to the adjacent word lines WLL+1 and WLL−1 are refreshed. An order in which the adjacent addresses L+1 and L−1 are applied may be changed.

Word line disturbance prevention illustrated in FIG. 2 needs a lengthy period since the memory should receive and process the commands CMDs and the addresses ADDS.

Figure 3:
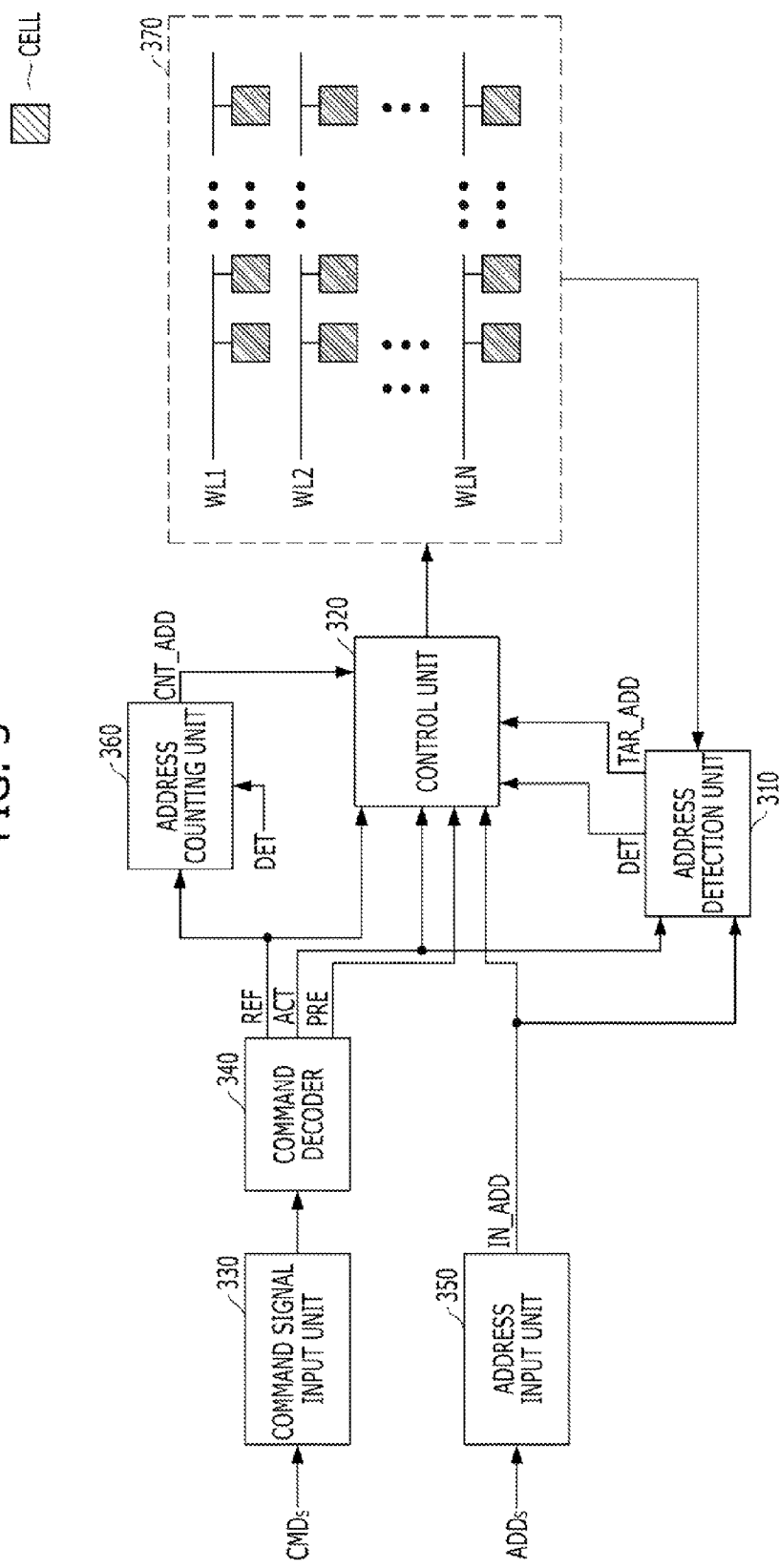
FIG. 3 is a block diagram illustrating a memory in accordance with an embodiment of the present invention.

FIG. 3 is a block diagram illustrating a memory in accordance with an embodiment of the present invention.

Referring to FIG. 3, the memory may include a plurality of word lines WL1 to WLN each of which are connected to one or more memory cells CELL, an address detection unit 310 suitable for detecting a target address TAR_ADD of a target word line among the plurality of word lines WL1 to WLN and a control unit 320 suitable for activating at least one word line among the plurality of word lines WL1 to WLN in response to a refresh command REF and activate at least one adjacent word line by using the address TAR_ADD in response to the refresh command REF after detection of the address TAR_ADD.

The memory may further include a command signal input unit 330, a command decoder 340, an address input unit 350, an address counting unit 360 and a cell array 370 that includes the plurality of word lines WL1 to WLN.

The memory will be described below in detail with reference to FIG. 3.

The command signal input unit 330 is configured to receive command signals CMDs that are applied from an outside and the address input unit 350 is configured to receive addresses ADDs that are applied from an outside. The command signals CMDs and the addresses ADDs may be multi-bit signals.

The command decoder 340 is suitable for decoding the command signals CMDs that are inputted through the command signal input unit 330 and generating the refresh command REF for activating a word line for a refresh operation, an active command ACT for an active operation and a precharge command PRE for a precharge operation. The command decoder 340 activates a command that is indicated by the combination of inputted command signals CMDs among the above-described commands. The command decoder 340 may also decode inputted command signals CMDs and generate commands to be used in a memory device such as a read command, a write command, a self refresh entry command and a self refresh exit command.

The address detection unit 310 detects a target word line among the plurality of word lines WL1 to WLN by referring to activation histories of the plurality of word lines WL1 to WLN. The activation histories may be the number of activations or activation frequencies of the plurality of word lines WL1 to WLN.

The address detection unit 310 may detect the target address TAR_ADD of the target word line when at least one of (1) the case where the number of activations of the target word line is equal to or greater than a reference number, and (2) the number of activations of the target word line per preset input number of an activation command is equal to or greater than a reference number per preset input number of the activation command. When the target address TAR_ADD is detected, the address detection unit 310 may activate a detection signal DET and outputs the target address TAR_ADD.

In detail, the address detection unit 310 may count the number of activations of the plurality of word lines WL1 to WLN and may detect the target address TAR_ADD of the target word line among the plurality of word lines WL1 to WLN by using a counting result.

Also, the address detection unit 310 may store the number of inputs of the active command ACT and the number of activations of the plurality of word lines WL1 to WLN and may detect the target address TAR_ADD of a target word line among the plurality of word lines WL1 to WLN.

The target word line and thus the target address TAR_ADD may be detected when a word line is activated M or more times per N inputs of the active command ACT. The target word line may be detected every N inputs of the active command ACT. The target word line and thus the target address TAR_ADD, may be detected when it is repeated L or more times that a word line is activated M or more times per N inputs of the active command ACT. The target word line may be detected every N*L inputs of the active command ACT. For example, the target word line and thus the target address TAR_ADD, may be detected when a specific word line is activated 3 or more times per 10 inputs of the active command ACT. For example, the target word line and thus the target address TAR_ADD, may be detected when it is repeated 5 or more times that a specific word line is activated 3 or more times per 10 inputs of the active command ACT. The condition for the target word line may vary according to designs.

The address counting unit 360 may generate a counting address CNT_ADD for designating a word line to be activated among the plurality of word lines WL1 to WLN in a refresh operation in response to the refresh command REF. The address counting unit 360 may increase the value of the counting address CNT_ADD by 1 in response to the refresh command REF in such a manner that, when a $K^{th}$ word line was activated in a previous refresh operation, a $K+1^{th}$ word line is activated in a next refresh operation in the case of activating only an adjacent word line in a refresh operation after detection of the target address TAR_ADD, the address counting unit 360 may not perform the counting operation when the refresh command REF is applied after activation of the detection signal DET.

The control unit 320 may activate and precharge some of the plurality of word lines WL1 to WLN in response to the active command ACT, the refresh command REF and the precharge command PRE, the detection signal DET, an address IN_ADD applied from an outside, the counting address CNT_ADD and the target address TAR_ADD. The control unit 320 may activate a word line corresponding to the address IN_ADD among the plurality of word lines WL1 to WLN in response to the active command ACT, activate a word line corresponding to the counting address CNT_ADD among the plurality of word lines WL1 to WLN in response to the refresh command REF and activate one or more adjacent word lines among the plurality of word lines WL1 to WLN in response to the refresh command REF after detection of the target address TAR_ADD.

The activation of the word line corresponding to the address IN_ADD in response to the active command ACT corresponds to activation for accessing, for example, reading or writing memory cells, irrespective of the refresh operation.

The activation of the word line corresponding to the counting address CNT_ADD in response to the refresh command REF under deactivation of the detection signal DEL, when the target address TAR_ADD is not detected, corresponds to activation for the normal refresh operation.

The activation of one or more adjacent word lines in response to the refresh command REF after the detection signal DET, when the target address TAR_ADD is detected, corresponds to activation for a special refresh operation for preventing word line disturbance.

In the special refresh operation, the control unit 320 may activate a word line corresponding to the counting address CNT_ADD and additionally activate one or more adjacent word lines using the target address TAR_ADD. Further, the control unit 320 may activate only one or more adjacent word lines using the target address TAR_ADD. Further, the special refresh operation may be performed after detection of two or more target addresses TAR_ADD such that adjacent word lines adjacent to the two or more target word lines are activated during the special refresh operation.

In the case of activation of the word line of the counting address CNT_ADD and the adjacent word lines, the address counting unit 360 may perform a counting operation during the special refresh operation. In the case of activation of the adjacent word lines only, the address counting unit 360 may keep the value of the counting address CNT_ADD until a next refresh operation.

The control unit 320 in the special refresh operation may sequentially activate all or part of the target word line and the adjacent word lines in correspondence to one refresh command REF and the remaining ones of the target word line and the adjacent word lines with another refresh command REF. Hereinafter, descriptions will be made for the case where the control unit 320 in the special refresh operation sequentially activates all of the target word lines and the adjacent word lines in correspondence to one refresh command REF and for the case of a first adjacent word line and a second adjacent word line respectively disposed immediately before and after the target word line.

Operations of the memory will be described below on the basis of the above descriptions.

The control unit 320 may activate a word line corresponding to the applied address IN_ADD in response to the active command ACT and precharge the activated word line in response to the precharge command PRE.

In response to the refresh command REF under deactivation of the detection signal DET, when the target address TAR_ADD is not detected, the control unit 320 may activate a word line corresponding to the counting address CNT_ADD and precharges the activated word line and the address counting unit 360 may change the value of the counting address CNT_ADD before or after a refresh operation.

In response to the refresh command REF under activation of the detection signal DEL which indicates detection of the target address TAR_ADD, the control unit 320 sequentially activates and precharges a target word line, a first adjacent word line and a second adjacent word line using the target address TAR_ADD. An order of activation and precharge may be changed. Also, as described above, a word line corresponding to the counting address CNT_ADD may be activated and precharged.

The memory in accordance with the embodiment of the present invention may activate adjacent word lines in a refresh operation after detection of the target address TAR_ADD and thus it is possible to prevent word line disturbance to data. Since the memory does not need any command or sequence for the special refresh operation, a time required for the special refresh operation may be minimized and thus the operation speed of the memory may be increased.

Figure 4:
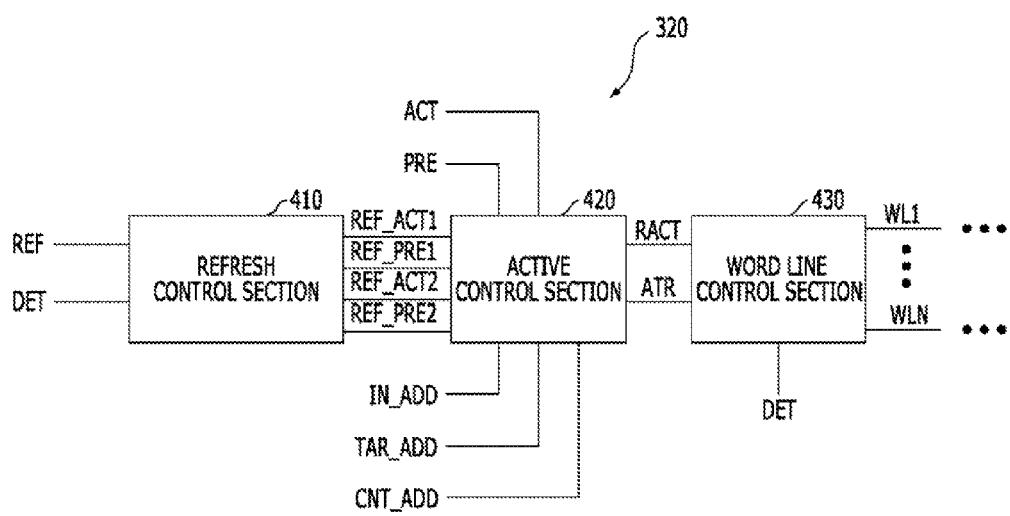
FIG. 4 is a block diagram illustrating a control unit of the memory shown in FIG. 3.

FIG. 4 is a block diagram illustrating the control unit 20 of the memory shown in FIG. 3.

Referring to FIG. 4, the control unit 320 includes a refresh control section 410, an active control section 420 and a word line control section 430.

The refresh control section 410 is suitable for controlling the normal refresh operation and the special refresh operation. The refresh control section 410 may activate a first refresh activation signal REF_ACT1 in response to the refresh command REF and activates a second refresh activation signal REF_ACT2 one or more times in response to the refresh command REF under activation of the detection signal DET indicating detection of the target address TAR_ADD.

The refresh control section 410 may activate the first refresh activation signal REF_ACT1 in response to the refresh command REF after activation of the detection signal DET, which is the case of activation of the word line of the counting address CNT_ADD and the adjacent word lines. The refresh control section 410 may not activate the first refresh activation signal REF_ACT1 in response to the refresh command REF after activation of the detection signal DEL which is the case of activation of the adjacent word lines only.

The refresh control section 410 may activate a first refresh precharge signal REF_PRE1 a predetermined time after activation of the first refresh activation signal REF_ACT1 and activate a second refresh precharge signal REF_PRE2 a predetermined time after activation of the second refresh activation signal REF_ACT2.

For example, when the refresh command REF is applied after detection of the target address TAR_ADD refresh control section 410 may activate the second refresh activation signal REF_ACT2 3 times. The target word line, the first adjacent word line and the second adjacent word line are sequentially activated at each activation of the second refresh activation signal REF_ACT2.

The active control section 420 is suitable for activating an active signal RACT in response to one from the active command ACT, the first refresh activation signal REF_ACT1 and the second refresh activation signal REF_ACT2. The active control section 420 may transfer to the word line control section 430 as address signals ATR, the applied address IN_ADD in response to the active command ACT, the counting address CNT_ADD in response to the first refresh activation signal REF_ACT1 and the target address TAR_ADD in response to the second refresh activation signal REF_ACT2. The active control section 420 deactivates the active signal RACT in response to one from the precharge command PRE, the first refresh precharge signal REF_PRE1 and the second refresh precharge signal REF_PRE2 under activation of the active signal RACT.

The word line control section 430 is suitable for activating a word line corresponding to the address signals ATR among the plurality of word lines WL1 to WLN in response to the active signal RACT and activate a word line adjacent to the word line corresponding to the address signals ATR under activation of the detection signal DET, which indicates detection of the target address TAR_ADD.

Figure 5:
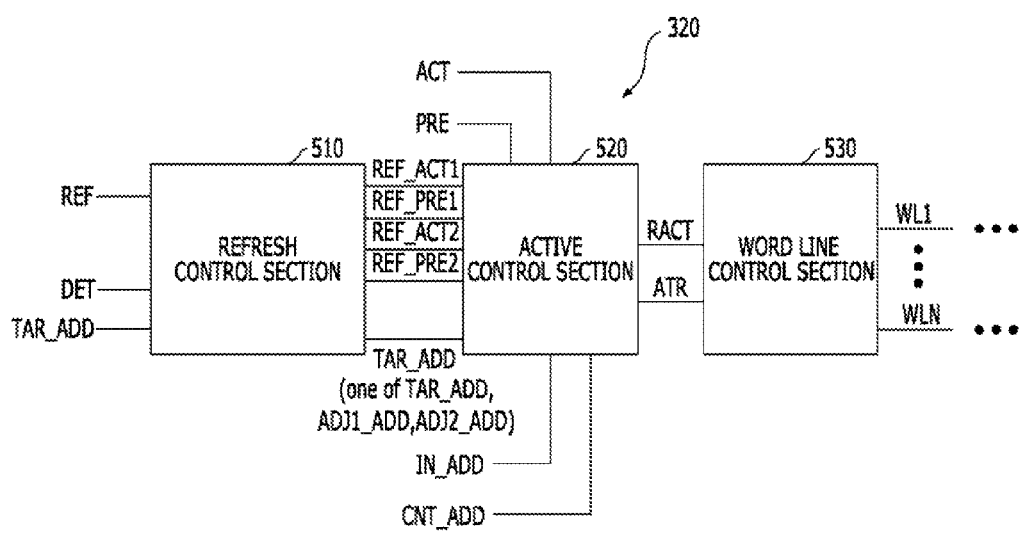
FIG. 5 is a block diagram illustrating a control unit of the memory shown in FIG. 3.

FIG. 5 is a block diagram illustrating the control unit 320 of the memory shown in FIG. 3.

Referring to FIG. 5, the control unit 320 includes a refresh control section 510, an active control section 520 and a word line control section 530.

The refresh control section 510 is suitable for controlling a normal refresh operation and the special refresh operation. The refresh control section 510 may activate a first refresh activation signal REF_ACT1 and activate a second refresh activation signal REF_ACT2 one or more times in response to the refresh command REF under activation of the detection signal DET indicating detection of the target address TAR_ADD. The refresh control section 510 may generate adjacent addresses ADJ1_ADD and ADJ2_ADD corresponding to adjacent word lines by using the target address TAR_ADD and outputs one of the target address TAR_ADD and the adjacent addresses ADJ1_ADD and ADJ2_ADD as an address TRR_ADD. The first adjacent address ADJ1_ADD may correspond to one of a first and a second adjacent word lines and the second adjacent address ADJ2_ADD may correspond to the other adjacent word line.

For example, assuming that sequentially increasing address values 1 to N are allocated to the plurality of word lines WL1 to WLN, when the value of the target address TAR_ADD is 'K', the refresh control section 510 may generate the first adjacent address ADJ1_ADD with the value of 'K−1' and the second adjacent address ADJ2_ADD with the value of 'K+1'. The refresh control section 510 may output to the active control section 520 as the address TRR_ADD the target address TAR_ADD in response to first activation of the second refresh activation signal REF_ACT2, the first adjacent address ADJ1_ADD in response to second activation of the second refresh activation signal REF_ACT2 and the second adjacent address ADJ2_ADD in response to third activation of the second refresh activation signal REF_ACT2. An order of the output may be changed according to a design.

The active control section 520 is suitable for activating an active signal RACT in response to one from the active command ACT, the first refresh activation signal REF_ACT1 and the second refresh activation signal REF_ACT2. The active control section 520 may transfer to the word line control section 530 as address signals ATR, the applied address IN_ADD in response to the active command ACT, the counting address CNT_ADD in response to the first refresh activation signal REF_ACT1 and the address TRR_ADD outputted from the refresh control section 510 in response to the second refresh activation signal REF_ACT2. The active control section 520 deactivates the active signal RACT in response to one from the precharge command PRE, a first refresh precharge signal REF_PRE1 and a second refresh precharge signal REF_PRE2 under activation of the active signal RACT.

The word line control section 530 is suitable for activating a word line corresponding to the address signals ATR among the plurality of word lines WL1 to WLN in response to the active signal RACT.

Figure 6:
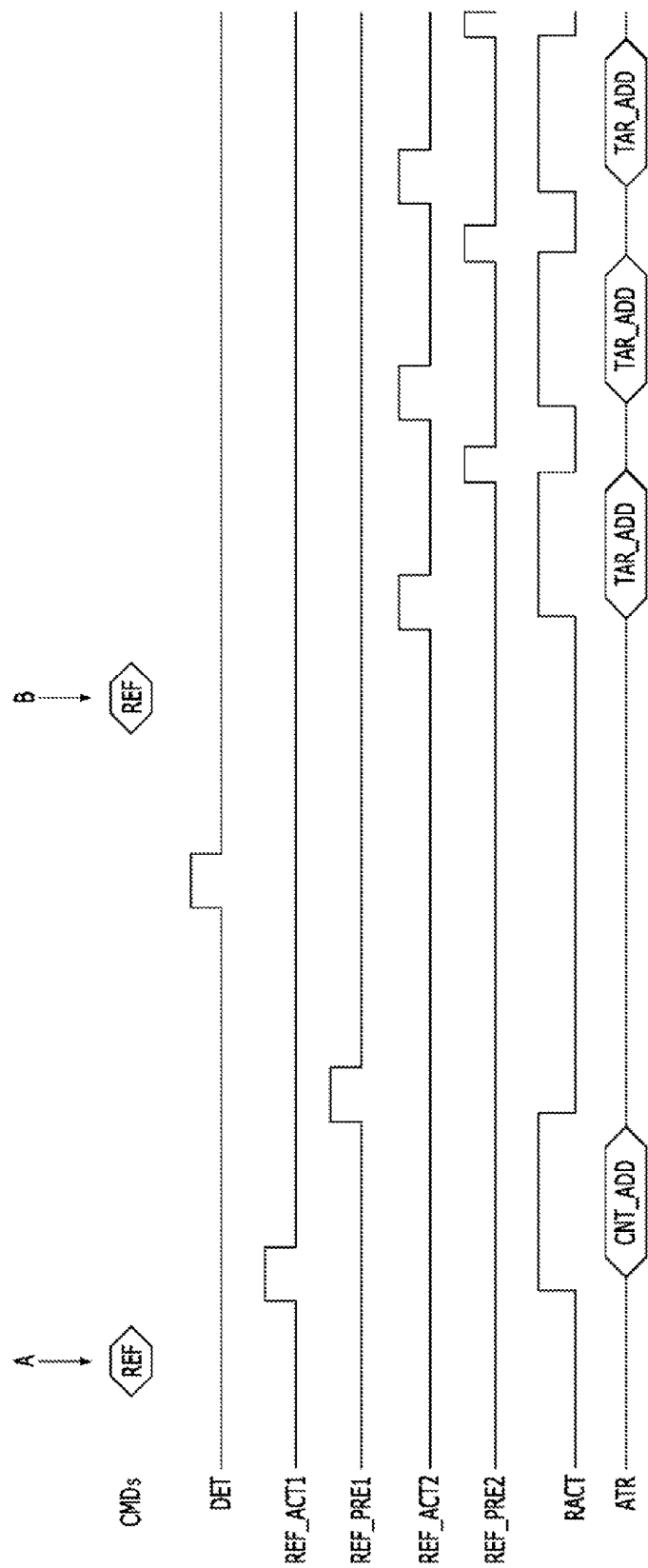
FIG. 6 is a timing diagram illustrating operations of the memory including the control unit shown in FIG. 4.

FIG. 6 is a timing diagram illustrating operations of the memory including the control unit 420 shown in FIG. 4.

When the refresh command REF is applied during deactivation of the detection signal DET ('A' illustrated in FIG. 6), the first refresh activation signal REF_ACT1 is activated and after the predetermined time the first refresh precharge signal REF_PRE1 is activated. The active signal RACT is sequentially activated and deactivated in response to activation of the first refresh activation signal REF_ACT1 and the first refresh precharge signal REF_PRE1. At this time, the counting address CNT_ADD is transferred to the word line control section 430 as the address signals ATR.

When the refresh command REF is applied after activation of the detection signal DET ('B' illustrated in FIG. 6), the second refresh activation signal REF_ACT2 is activated 3 times and the second refresh precharge signal REF_PRE2 is activated 3 times subsequent to the predetermined time after each activation of the second refresh activation signal REF_ACT2. The active signal RACT is sequentially activated and deactivated in response to activation of the second refresh activation signal REF_ACT2 and the second refresh precharge signal REF_PRE2. The target address TAR_ADD is transferred to the word line control section 430 as the address signals ATR during activation of the active signal RACT.

Figure 7:
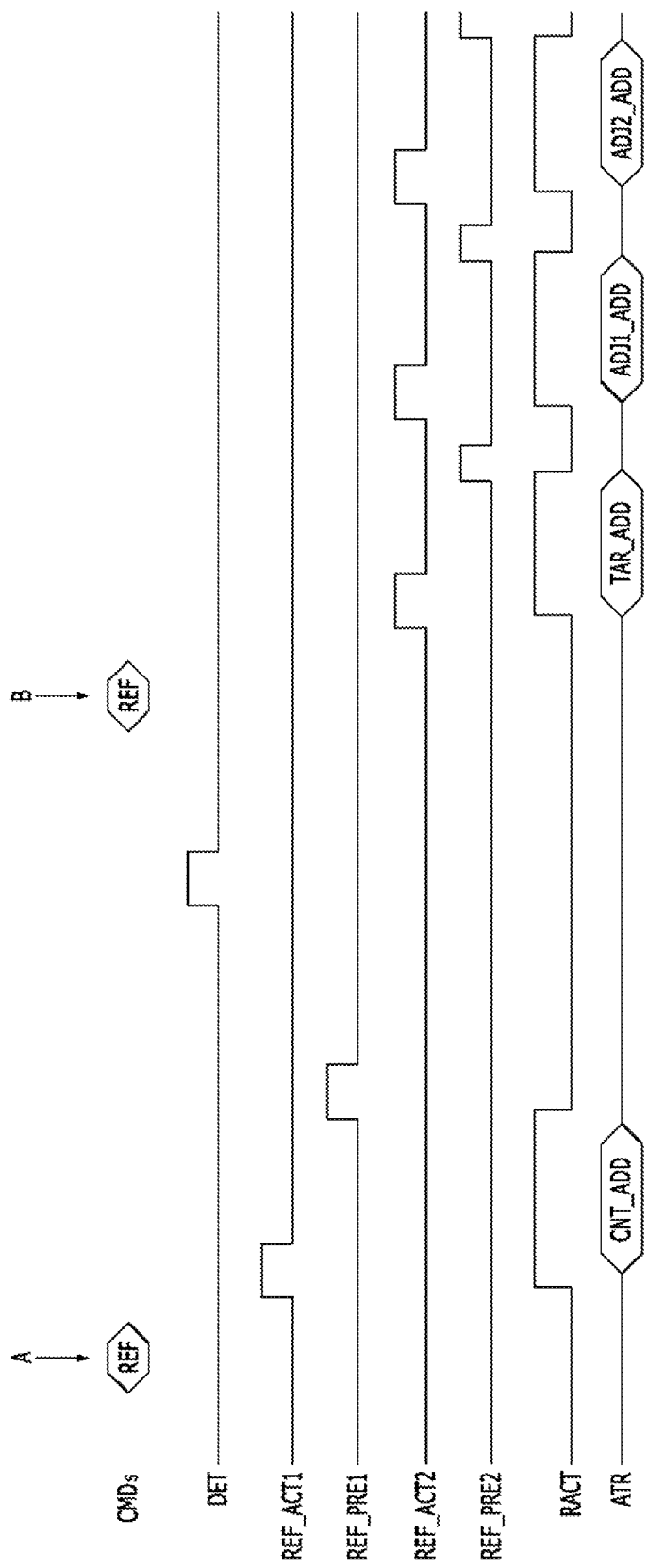
FIG. 7 is a timing diagram illustrating operations of a memory including a control unit shown in FIG. 5.

FIG. 7 is a timing diagram illustrating operations of the memory including the control unit 520 shown in FIG. 5.

When the refresh command REF is applied during deactivation of the detection signal DET ('A' illustrated in FIG. 7), the first refresh activation signal REF_ACT1 is activated and after the predetermined time the first refresh precharge signal REF_PRE1 is activated. The active signal RACT is sequentially activated and deactivated in response to activation of the first refresh activation signal REF_ACT1 and the first refresh precharge signal REF_PRE1. At this time, the counting address CNT_ADD is transferred to the word line control section 530 as the address signals ATR.

When the refresh command REF is applied after activation of the detection signal DET, the second refresh activation signal REF_ACT2 is activated 3 times and the second refresh precharge signal REF_PRE2 is activated 3 times subsequent to the predetermined time after each activation of the second refresh activation signal REF_ACT2. The active signal RACT is sequentially activated and deactivated in response to activation of the second refresh activation signal REF_ACT2 and the second refresh precharge signal REF_PRE2. The target address TAR_ADD, the first adjacent address ADJ1_ADD and the second adjacent address ADJ2_ADD are sequentially transferred to the word line control section 530 as the address signals ATR during activation of the active signal RACT.

Figure 8:
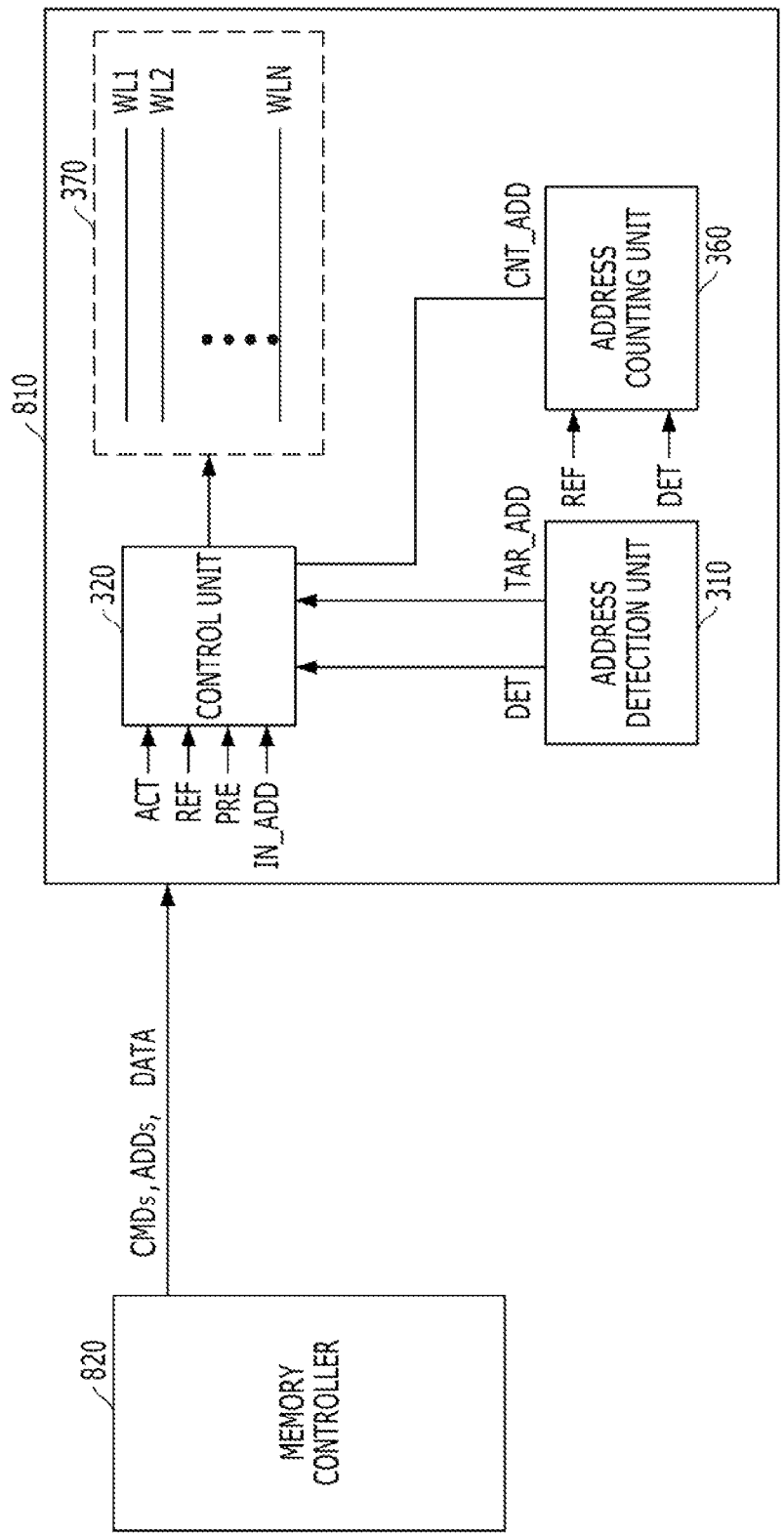
FIG. 8 is a block diagram illustrating a memory system in accordance with an embodiment of the present invention.

FIG. 8 is a block diagram illustrating a memory system in accordance with an embodiment of the present invention. The memory system of FIG. 8 may include the memory in accordance with an embodiment of the present invention. The memory system of FIG. 8 may include the memory of FIG. 3.

Referring to FIG. 8, the memory system may include a memory 810 and a memory controller 820. The memory 810 may include a plurality of word lines WL1 to WLN to each of which are connected to one or more memory cells, the address detection unit 310, the address counting unit 360 and the control unit 320, which are described with reference to FIGS. 3 to 7. The memory 810 is suitable for activating a word line corresponding to the counting address CNT_ADD among the plurality of word lines WL1 to WLN in response to the refresh command REF and activate one or more adjacent word lines by using the target address TAR_ADD in response to the refresh command REF under activation of the detection signal DET indicating detection of the target address TAR_ADD. The memory controller 820 is suitable for applying to the memory 810 a plurality of command signals CMDs corresponding to the refresh command REF in a refresh operation and a plurality of command signals CMDs and addresses ADDs corresponding to an active command ACT in an active operation.

Operations of the memory system will be described below with reference to FIG. 8.

The memory controller 820 may control the memory 810 and applies a plurality of command signals CMDs, addresses ADDs and data DATA to the memory 810. The plurality of command signals CMDs may include a chip select signal CSB, an active control signal ACTB, a row address strobe signal RASB, a column address strobe signal CASB and a write enable signal WEB. The memory controller 820 applies the plurality of command signals CMDs corresponding to the refresh command REF to allow the memory 810 to perform the refresh operation and applies the plurality of command signals CMDs and addresses ADDs corresponding to the active command ACT to allow the memory 810 to perform the active operation.

The memory 810 performs a predetermined operation in response to the signals applied from the memory controller 820. In the case where a plurality of command signals CMDs correspond to the active command ACT, the memory 810 activates a word line corresponding to an applied address IN_ADD, which is the same as the addresses ADDs. In the case where a plurality of command signals CMDs correspond to the refresh command REF, the memory 810 may perform different operations according to detection of the target address TAR_ADD. Under deactivation of the detection signal DET indicating that the target address TAR_ADD is not detected, a word line corresponding to the counting address CNT_ADD is activated. Under activation of the detection signal DET indicating that the target address TAR_ADD is detected, one or more adjacent word lines are activated using the target address TAR_ADD. Detailed configuration and operations of the memory 810 are the same as those described above with reference to FIGS. 3 to 7.

The memory system in accordance with the embodiment of the present invention may activate adjacent word lines in the memory 810 in a refresh operation after detection of the target address TAR_ADD and thus it is possible to prevent word line disturbance to data. Since the memory system does not need any commands or sequence for the special refresh operation, a time required for the special refresh operation may be minimized and thus the operation speed of the memory system may be increased.

Figure 9:
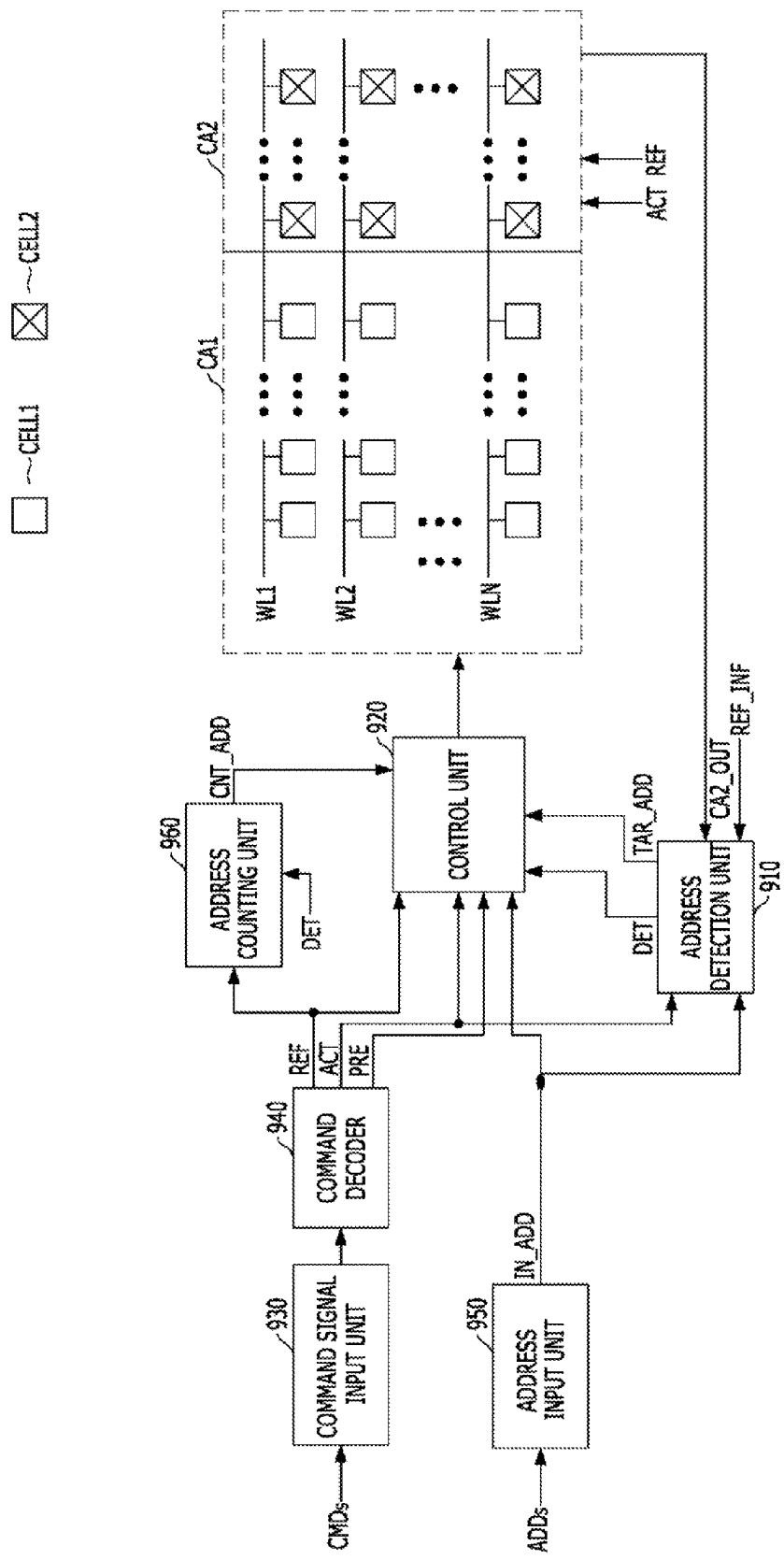
FIG. 9 is a block diagram illustrating a memory in accordance with an embodiment of the present invention.

FIG. 9 is a block diagram illustrating a memory in accordance with an embodiment of the present invention. An address detection unit 910 of the memory of FIG. 9 detects a target address TAR_ADD of target word line with the number of activation times that is equal to of greater than a reference number of times.

Referring to FIG. 9, the memory may include a first cell array CA1 including a plurality of first memory cells CELL1 that are connected to a plurality of word lines WL1 to WLN, a second cell array CA2 including a plurality of second memory cells CELL2 that are connected to the plurality of word lines WL1 to WLN and store the number of activations of the word lines connected thereto among the plurality of word lines WL1 to WLN, an address detection unit 910 suitable for detecting the target address TAR_ADD of the target word line among the plurality of word lines WL1 to WLN by referring to the values stored in the plurality of second memory cells CELL2. The memory may further include the control unit 920, the command signal input unit 930, the command decoder 940, the address input unit 950 and the address counting unit 960, wherein each like reference numeral refers to like parts that are described above with reference to FIGS. 3 to 7.

The memory will be described below in detail with reference to FIG. 9.

FIG. 9 illustrates an embodiment in accordance with the present invention for detecting a target address that has the number of activations equal to or greater than the reference number, in the memory of FIG. 3.

The operations of the memory of FIG. 9 will be described below with focus on the operations of the second cell array CA2 and the address detection unit 910.

The value stored in the plurality of second memory cells CELL2, which are connected to the word line activated in response to the applied active command ACT, is increased. The value stored in the plurality of second memory cells CELL2 that are connected to the activated word line may be increased by 1. Therefore, the value stored in the second memory cells CELL2 that are connected to a word line is increased in proportion as the number of activations of the word line is increased. That is, the values stored in the second memory cells CELL2 correspond to the numbers of activation of the word lines connected thereto.

The address detection unit 910 may receive a value CA2_OUT that is stored in the second memory cells CELL2 of a currently activated word line, compare the value CA2_OUT with reference information REF_INF corresponding to the reference number, activate a detection signal DET and store and output a currently inputted address IN_ADD as the target address TAR_ADD in the case where the value CA2_OUT is equal to or greater than the reference information REF_INF.

The value stored in the plurality of second memory cells CELL2 that are connected to the word line activated in response to the applied refresh command REF is initialized. The value stored in the plurality of second memory cells CELL2 that are connected to the activated word line may be initialized to a value corresponding to a logic value representing that the number of activations is '0'. When a refresh operation has been performed, the number of activations of each word line is counted again from the start.

The memory in accordance with the embodiment of the present invention may activate adjacent word lines in a refresh operation after detection of the target address TAR_ADD and thus it is possible to prevent word line disturbance to data. Since the memory does not need any commands or sequence for the special refresh operation, a time required for the special refresh operation may be minimized and thus the operation speed of the memory may be increased.

For reference, each of the address IN_ADD, the target address TAR_ADD, the counting address CNT_ADD, the reference information REF_INF, the output value CA2_OUT and the adjacent addresses ADJ1_ADD and ADJ2_ADD may be a multi-bit digital signal.

Although various embodiments have been described for illustrative purposes, it will be apparent to those skilled in the art that various changes and modifications may be made without departing from the spirit and scope of the invention as defined in the following claims.

What is claimed is:

1. A memory including instruction codes executed by one or more microprocessors to perform operations comprising:
   a plurality of word lines each of which are connected to one or more memory cells, wherein each of the memory cells includes a cell transistor and a cell capacitor;
   performing a counting operation in response to a refresh command and generating a counting address according to a result of the counting operation;
   detecting a target address of a target word line among the plurality of word lines, wherein the target word line has an activation history satisfying a predetermined condition;
   activating a first refresh activation signal in response to the refresh command, activating a second refresh activation signal two or more times when the refresh command is applied after the target address is detected, generating a first adjacent address by subtracting 1 from the target address and a second adjacent address by add 1 to the target address, and outputting the target address, the first adjacent address or the second adjacent address;
   activating an active signal in response to an active command, the first refresh activation signal or the second refresh activation signal, transferring an external applied address as address signals when the active command is activated, transferring the counting address as the address signals when the first refresh activation signal is activated and transferring the generated address of one of the target address, the first adjacent address and the second adjacent address as the address signals when the second refresh activation signal is activated; and
   sequentially activating and precharging a word line corresponding to the transferred address signals among the plurality of word lines when the active signal is activated;
   wherein the predetermined condition is that a number of activations of the target word line is equal to or greater than a reference number.

2. The memory according to claim 1, wherein the predetermined condition is that the number of activations of the target word line per preset input number of an activation command is equal to or greater than a reference number per preset input number of the activation command.

3. The memory according to claim 1, wherein activating and precharging a first adjacent word line corresponding to the first adjacent address, activating and precharging a second adjacent word line corresponding to the second adjacent address, when the refresh command is applied after the target address is detected,
   wherein the first and second adjacent word line is adjacent to the target word line and identified by the target address.

4. The memory according to claim 1, wherein activating a second refresh activation signal three times when the refresh command is applied after the target address is detected, outputting the target address in first, outputting the first adjacent address in second, and outputting the second adjacent address in second.

5. The memory according to claim 1, wherein the plurality of word lines includes first to Nth word lines, and sequentially increasing address values 1 to N are allocated to the first to Nth word lines, wherein N is equal or greater than 2.

* * * * *